United States Patent
Kim et al.

(10) Patent No.: US 10,937,788 B2
(45) Date of Patent: Mar. 2, 2021

(54) MEMORY DEVICE HAVING VERTICAL STRUCTURE

(71) Applicant: SAMSUNG ELECTRONICS CO., LTD., Suwon-si (KR)

(72) Inventors: Nam-Gun Kim, Yongin-si (KR); Sang-min Lee, Hwaseong-si (KR); Tae-Seop Choi, Hwaseong-si (KR); Kon Ha, Suwon-si (KR); Seung-jae Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/809,913

(22) Filed: Mar. 5, 2020

(65) Prior Publication Data

US 2020/0203348 A1   Jun. 25, 2020

Related U.S. Application Data

(63) Continuation of application No. 16/253,291, filed on Jan. 22, 2019, now Pat. No. 10,622,360, which is a (Continued)

(30) Foreign Application Priority Data

Aug. 11, 2016   (KR) .................. 10-2016-0102442

(51) Int. Cl.
*H01L 27/108*   (2006.01)
*H01L 21/768*   (2006.01)
(Continued)

(52) U.S. Cl.
CPC .. *H01L 27/10814* (2013.01); *H01L 21/76801* (2013.01); *H01L 21/76841* (2013.01);
(Continued)

(58) Field of Classification Search
CPC ......... H01L 27/10814; H01L 27/10888; H01L 21/76897; H01L 23/5226; H01L 21/7682;
(Continued)

(56) References Cited

U.S. PATENT DOCUMENTS 7,920,383 B2   4/2011   Yang et al.
8,184,439 B2   5/2012   Baek et al.
(Continued)

FOREIGN PATENT DOCUMENTS

KR   10-2016-0012826 A   2/2016

*Primary Examiner* — Jasmine J Clark
(74) *Attorney, Agent, or Firm* — Lee IP Law, P.C.

(57) ABSTRACT

A semiconductor device includes a substrate with an active region, a plurality of conductive line structures on the substrate, an insulating layer separating the plurality of conductive line structures from the substrate, a contact plug between every two adjacent conductive line structures, an insulating spacer structure between each conductive line structure and a corresponding contact plug, a landing pad connected to each contact plug, and a landing pad insulation pattern having an asymmetrical shape based on a vertical axis of the landing pad that extends along a normal to the substrate. The landing pad insulation pattern includes a first portion overlapping the conductive line structures and a second portion overlapping the contact plug, the first and second portions being on opposite sides of the vertical axis.

20 Claims, 11 Drawing Sheets

Related U.S. Application Data continuation of application No. 15/598,570, filed on May 18, 2017, now Pat. No. 10,224,332.

(51) Int. Cl.
*H01L 23/522* (2006.01)
*H01L 23/528* (2006.01)
*H01L 23/532* (2006.01)

(52) U.S. Cl.
CPC ........ *H01L 23/528* (2013.01); *H01L 23/5226* (2013.01); *H01L 23/5329* (2013.01); *H01L 23/53209* (2013.01); *H01L 27/10847* (2013.01); *H01L 27/10855* (2013.01); *H01L 27/10888* (2013.01); *H01L 21/7682* (2013.01); *H01L 21/76897* (2013.01)

(58) Field of Classification Search
CPC ............. H01L 23/528; H01L 21/76801; H01L 23/5329; H01L 23/53209; H01L 27/10855; H01L 21/76841

See application file for complete search history.

(56) References Cited

U.S. PATENT DOCUMENTS

| | | | |
|---|---|---|---|
| 8,399,342 | B2 | 3/2013 | Kim |
| 8,710,570 | B2 | 4/2014 | Lee |
| 9,041,122 | B2 | 5/2015 | Yoo et al. |
| 10,037,999 | B2 * | 7/2018 | Kim .................. H01L 27/10855 |
| 2015/0061134 | A1 | 3/2015 | Lee et al. |
| 2015/0214146 | A1 | 7/2015 | Kim et al. |
| 2015/0214152 | A1 | 7/2015 | Park |
| 2015/0214291 | A1 | 7/2015 | Park et al. |
| 2015/0303201 | A1 | 10/2015 | Lee et al. |
| 2016/0027727 | A1 | 1/2016 | Kim et al. |
| 2016/0351501 | A1 | 12/2016 | Chun |
| 2017/0271463 | A1 | 9/2017 | Lim et al. |

* cited by examiner

MEMORY DEVICE HAVING VERTICAL STRUCTURE

CROSS-REFERENCE TO RELATED APPLICATIONS

This is a continuation application based on pending application Ser. No. 16/253,291, filed Jan. 22, 2019, now U.S. Pat. No. 10,622,360, issued Apr. 14, 2020, which in turn is a continuation of application Ser. No. 15/598,570, filed May 18, 2017, now U.S. Pat. No. 10,224,332 B2, issued Mar. 5, 2019, the entire contents of both being hereby incorporated by reference.

Korean Patent Application No. 10-2016-0102442, filed on Aug. 11, 2016, in the Korean Intellectual Property Office, and entitled: "Memory Device Having Vertical Structure," is incorporated by reference herein in its entirety.

BACKGROUND

1. Field

Embodiments relate to a semiconductor device, and more particularly, to a semiconductor device including a landing pad for connecting an active region of a substrate with a lower electrode of a capacitor.

2. Description of the Related Art

Due to the development of electronic technologies, downscaling of semiconductor devices has rapidly progressed, and a separation distance between a plurality of interconnection lines and a plurality of contact plugs between the interconnection lines has been gradually reduced.

SUMMARY

According to an aspect of embodiments, there is provided a semiconductor device including a substrate including an active region, a plurality of conductive line structures separated from the substrate with an insulating layer therebetween and extending in parallel with one another in a direction on the substrate, a plurality of contact plugs respectively formed between every two adjacent conductive line structures from among the plurality of conductive line structures, a plurality of insulating spacer structures respectively between the plurality of conductive line structures and the plurality of contact plugs, each of the plurality of insulating spacer structures including an air spacer, and a plurality of landing pads respectively connected to the plurality of contact plugs and separated from each other by a landing pad insulation pattern, wherein the landing pad insulation pattern is asymmetrical based on a line perpendicular to a main surface of the substrate, in a cross-sectional view perpendicular to a direction to which the plurality of conductive line structures extend.

According to another aspect of embodiments, there is provided a semiconductor device including a substrate including an active region, a plurality of conductive line structures separated from the substrate with an insulating layer therebetween, each of the plurality of conductive line structures including a conductive line and an insulating capping line formed on the conductive line, a plurality of contact plugs respectively formed between every two adjacent conductive line structures from among the plurality of conductive line structures, a plurality of insulating spacer structures respectively between the plurality of conductive line structures and the plurality of contact plugs, and a plurality of landing pads respectively connected to the plurality of contact plugs and separated from each other by a landing pad insulation pattern, wherein the landing pad insulation pattern includes a stair shaped-portion.

According to another aspect of embodiments, there is provided a semiconductor device including a substrate with an active region, a plurality of conductive line structures on the substrate, an insulating layer separating the plurality of conductive line structures from the substrate, a contact plug between every two adjacent conductive line structures, an insulating spacer structure between each conductive line structure and a corresponding contact plug, a landing pad connected to each contact plug, and a landing pad insulation pattern separating every two adjacent landing pads from each other, each of the landing pad insulation patterns having an asymmetrical shape based on a vertical axis of the landing pad that extends along a normal to the substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
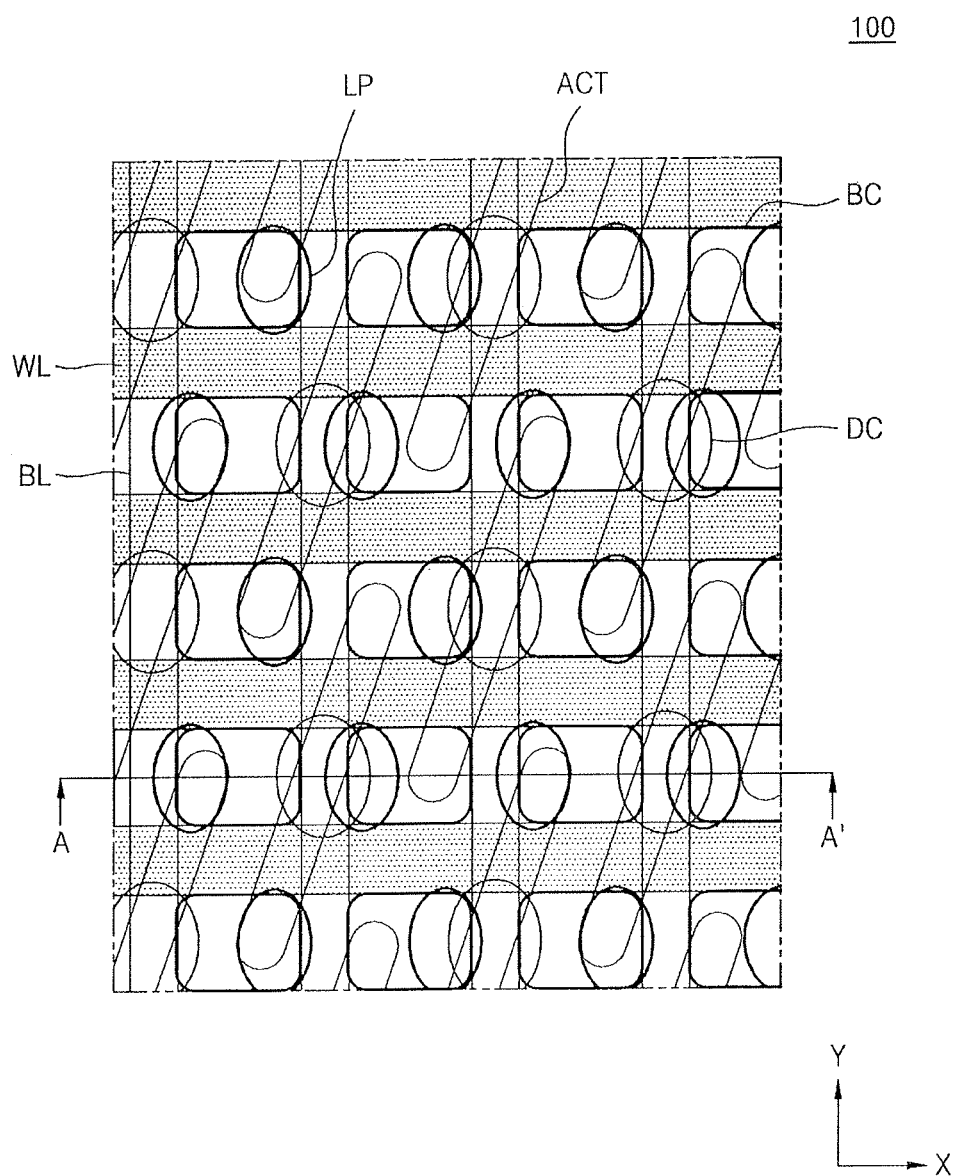
FIG. 1 illustrates a schematic layout of a memory cell array region of a semiconductor device according to an embodiment.

Embodiments will now be described more fully hereinafter with reference to the accompanying drawings; however, they may be embodied in different forms and should not be construed as limited to the embodiments set forth herein. Like reference numerals denote like elements in the drawings.

FIG. 1 is a schematic layout of a memory cell array region of a semiconductor device 100 according to an embodiment.

Referring to FIG. 1, the semiconductor device 100 may include a plurality of active regions ACT. The plurality of active regions ACT may be arranged at an oblique direction with respect to a first direction (X direction) and a second direction (Y direction).

A plurality of word lines WL may extend in parallel with one another in the first direction (X direction) across the plurality of active regions ACT. A plurality of bit lines BL may extend in parallel with one another, above the plurality of word lines WL, in the second direction (Y direction) perpendicular to the first direction (X direction).

The plurality of bit lines BL may be respectively connected to the plurality of active regions ACT via direct contacts DC. In some embodiments, a plurality of buried contacts BC may be formed between every two adjacent bit lines BL. The plurality of buried contacts BC may be arranged in a matrix form in the first direction (X direction) and the second direction (Y direction).

A plurality of conductive landing pads LP may be respectively formed on the plurality of buried contacts BC. The plurality of buried contacts BC and the plurality of conductive landing pads LP may connect lower electrodes of capacitors, respectively formed on the plurality of bit lines BL, to the active regions ACT. The plurality of conductive landing pads LP may be respectively arranged to partially overlap the plurality of buried contacts BC.

Figure 2A:
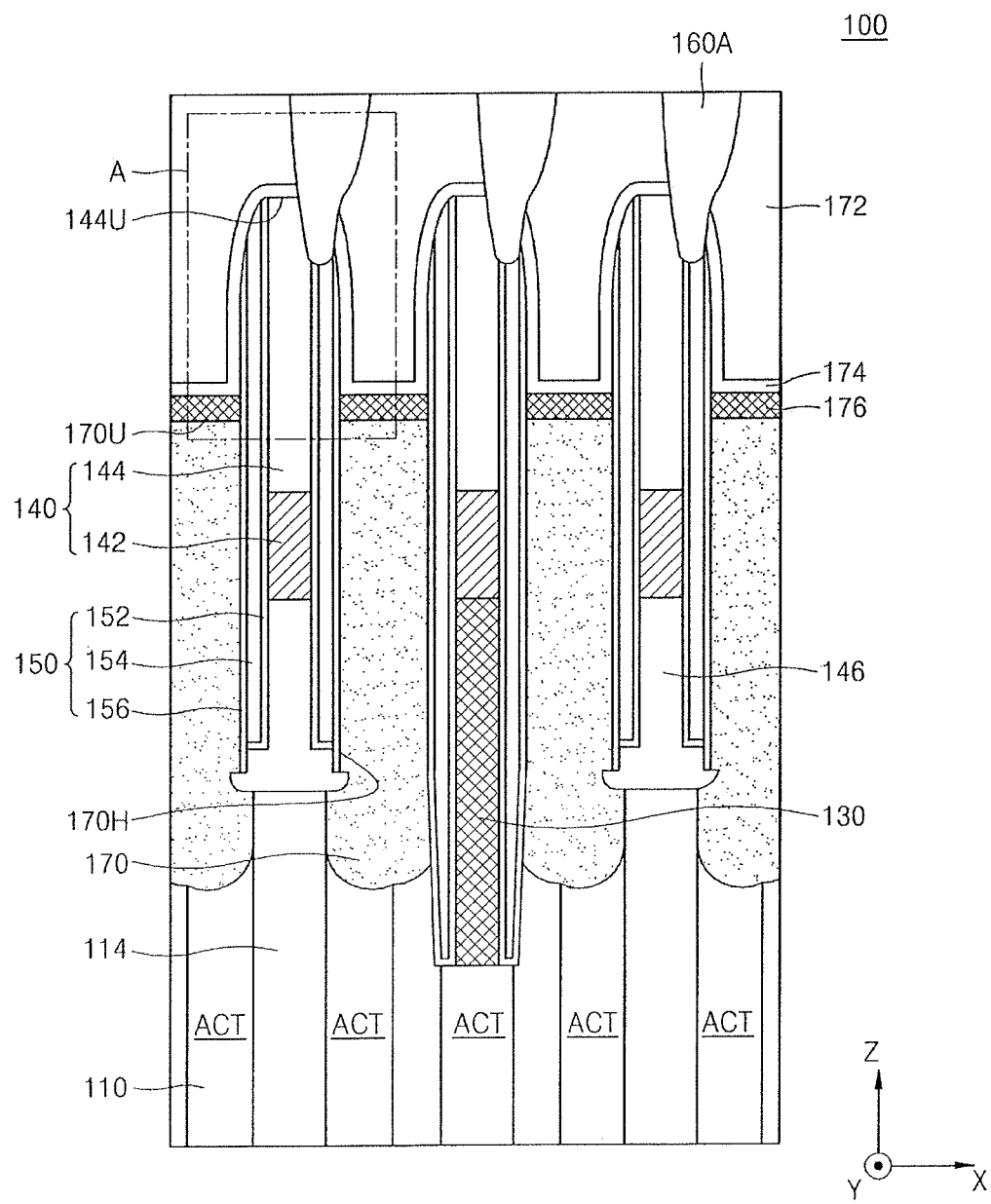
FIG. 2A illustrates a cross-sectional view along line A-A' of FIG. 1.
Figure 2B:
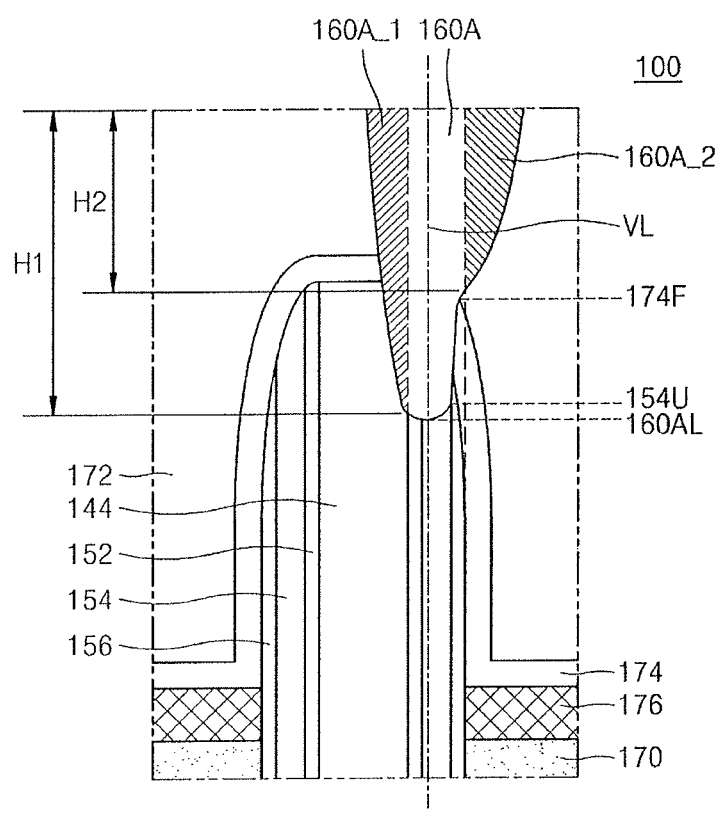
FIG. 2B illustrates a magnified view of a region A of FIG. 2A.

FIG. 2A is a cross-sectional view along line A-A' of FIG. 1. FIG. 2B is a magnified view of a region A of FIG. 2A.

Referring to FIGS. 1 and 2A, the semiconductor device 100 may include a substrate 110, in which the plurality of active regions ACT is defined by an isolation layer 114. The isolation layer 114 is formed inside an isolation trench formed in the substrate 110.

In some embodiments, the substrate 110 may include silicon (Si), e.g., single crystalline silicon, polycrystalline silicon, or amorphous silicon. In some other embodiments, the substrate 110 may include at least one of, e.g., germanium (Ge), silicon germanium (SiGe), silicon carbide (SiC), gallium arsenide (GaAs), indium arsenide (InAs), and indium phosphide (InP). In some embodiments, the substrate 110 may include a conductive region, e.g., a well doped with impurities or a structure doped with impurities. In some embodiments, the substrate 110 may have various isolation structures, e.g., a buried oxide (BOX) layer structure and a shallow trench isolation (STI) structure.

The isolation layer 114 may include at least one of oxide and nitride. In some embodiments, the isolation layer 114 may be a single layer including one type of insulating layer or multiple layers including a combination of at least three types of insulating layers.

A plurality of conductive lines 142 separated from the substrate 110 with an insulating layer 146 therebetween may be formed on the substrate 110. The plurality of conductive lines 142 may extend in parallel with one another in a direction (the Y direction) on the substrate 110. Although an example in which each of the conductive lines 142 includes a single layer is illustrated in FIG. 2A, embodiments are not limited thereto, e.g., each of the conductive lines 142 may have a multi-layer structure including a double layer, a triple layer, or more layers.

In some embodiments, the plurality of conductive lines 142 may form a plurality of bit lines. The plurality of conductive lines 142 may correspond to the bit lines BL illustrated in FIG. 1.

A plurality of direct contacts 130 that are connected to the active region ACT of the substrate 110 may be formed under a plurality of conductive line structures 140. The plurality of direct contacts 130 may be electrically and physically connected to some of the plurality of conductive line structures 140. The plurality of direct contacts 130 may be more deeply formed in a direction (opposite direction to a Z direction) toward the substrate 110, compared to the insulating layer 146 connected to some of the plurality of conductive line structures 140. The plurality of direct contacts 130 may correspond to the direct contacts DC illustrated in FIG. 1. In some embodiments, the plurality of direct contacts 130 may include, e.g., Si, Ge, W, WN, Co, Ni, Al, Mo, Ru, Ti, TiN, Ta, TaN, Cu, or a combination thereof. In some embodiments, the plurality of direct contacts 130 may include an epitaxial silicon layer.

A plurality of insulating capping lines 144 may be respectively formed on the plurality of conductive lines 142. Accordingly, one conductive line 142 and one insulating capping line 144 covering the conductive line 142 may form one conductive line structure 140.

A plurality of contact plugs 170 may be respectively formed between every two adjacent conductive line structures 140 from among the plurality of conductive line structures 140. The plurality of contact plugs 170 are respectively connected to the active regions ACT of the substrate 110 and extend in a direction (the Z direction) perpendicular to a direction in which a main surface of the substrate 110 extends. Upper surface levels of the contact plugs 170 may be lower than those of the conductive line structures 140. In other words, the heights of upper surfaces 170U of the contact plugs 170 may be lower than the heights of upper surfaces 144U of the insulating capping lines 144 relatively to a bottom of the substrate 110. The plurality of contact plugs 170 may include, e.g., semiconductor material doped with impurities, metal, conductive metal nitride, metal silicide, or a combination thereof, but are not limited thereto.

A plurality of landing pads 172 may be formed to be respectively connected to the contact plugs 170 and to vertically overlap the plurality of conductive line structures 140, respectively. The plurality of landing pads 172 may include, e.g., doped polysilicon, metal, metal silicide, conductive metal nitride, or a combination thereof. The plurality of landing pads 172 may include, e.g., metal, metal nitride, conductive polysilicon, or a combination thereof. For example, the plurality of landing pads 172 may include tungsten. The plurality of landing pads 172 may have a plurality of island-type pattern shapes on a horizontal plane.

The plurality of landing pads 172 may be electrically and physically separated from each other by a landing pad insulation pattern 160A. The landing pad insulation pattern 160A may include an insulation material, e.g., silicon oxide or silicon nitride. The landing pad insulation pattern 160A will be described in detail with reference to FIG. 2B later.

A plurality of insulating spacer structures 150 may be formed on, e.g., both, sidewalls of the conductive line structures 140, respectively. One insulating spacer structure 150 may be between one conductive line structure 140 and one contact plug 170. Each of the insulating spacer structures 150 may include an internal insulating spacer 152, an air spacer 154, and an external insulating spacer 156. Although an example in which each of the insulating spacer structures 150 includes a triple layer is illustrated in FIG. 2A, embodiments are not limited thereto, e.g., each of the insulating spacer structures 150 may include a single layer, a double layer, or a multi-layer structure including four or more layers. An upper limit of the air spacer 154 may be limited by the landing pad insulation pattern 160A, e.g., and the conductive barrier layer 174.

The air spacer 154 may extend in a direction in which the plurality of conductive line structures 140 extend. Also, the air spacer 154 may be formed to overlap each of the plurality of conductive lines 142 in the direction in which the main surface of the substrate 110 extends. As the air spacer 154 is formed between each conductive line 142 and each contact plug 170 within a limited space of a highly scaled high density semiconductor device, relative permittivity between each conductive line 142 and each contact plug 170 may be reduced, and thus, capacitance between adjacent conductive materials may be reduced.

A metal silicide layer 176 may be formed on the plurality of contact plugs 170. The plurality of contact plugs 170 may be respectively connected to the plurality of landing pads 172 via the metal silicide layer 176. The metal silicide layer 176 may include, e.g., at least one of cobalt silicide ($CoSi_x$), nickel silicide $NiSi_x$, and manganese silicide $MnSi_x$, but is not limited thereto. In some embodiments, the metal silicide layer 176 may be omitted.

A conductive barrier layer 174 may be formed on the metal silicide layer 176 and the insulating spacer structures 150. Also, the conductive barrier layer 174 may cover lower surfaces of the landing pads 172. In some embodiments, the conductive barrier layer 174 may have, e.g., a Ti/TiN stack structure.

Referring to FIGS. 2A and 2B, the landing pad insulation pattern 160A may include a first region 160A_1 overlapping the conductive line structures 140 and a second region 160A_2 overlapping the contact plugs 170, in a direction perpendicular to the main surface of the substrate 110. For example, as illustrated in FIGS. 2A-2B, landing pad insulation pattern 160A may extend vertically between two adjacent landing pads 172 to contact an insulation capping line 144 of a corresponding conductive line structure 140, e.g., a bottom portion of the landing pad insulation pattern 160A may penetrate an edge of the conductive barrier layer 174 to contact the insulation capping line 144 and the air spacer 154. Accordingly, the first region 160A_1 penetrates the conductive barrier layer 174 and overlaps the conductive line structures 140, and the second region 160A_2 is external with respect to the conductive barrier layer 174 and overlaps the contact plugs 170.

The landing pad insulation pattern 160A may be formed asymmetrically based on a line VL that passes a lowest point 160AL of the landing pad insulation pattern 160A and is perpendicular to the main surface of the substrate 110. In detail, a depth H1 of the first region 160A_1 may be greater than a depth H2 of the second region 160A_2, and a distance from the line VL to the first region 160A_1 may be less than a distance from the line VL to the second region 160A_2. Further, a width at a widest part of the first region 160A_1 along the X direction may be smaller than a width at a widest part of the second region 160A_2 along the X direction (shaded regions in FIG. 2B).

An absolute value of an average gradient of a surface at which the first region 160A_1 contacts one of the landing pads 172 may be greater than that of an average gradient of a surface at which the second region 160A_2 contacts one of the landing pads 172. In other words, the ratio of the depth H1 of the first region 160A_1 to the width of the first region 160A_1 may be greater than that of the depth H2 of the second region 160A_2 to the width of the second region 160A_2.

Accordingly, due to the above-stated geometric characteristics of the landing pad insulation pattern 160A, the air spacer 154, which overlaps each of the plurality of conductive lines 142 in the direction in which the main surface of the substrate 110 extends, may be easily formed. This is because in the process of etching a portion of a conductive layer that is formed on the conductive barrier layer 174 to form the landing pad insulation pattern 160A, it is possible to expose a path for forming the air spacer 154 as well as not to widely etch the cross-sectional area of the conductive layer.

In addition, since it is possible to form the landing pad insulation pattern 160A without widely etching the cross-sectional area of the conductive layer that is formed on the conductive barrier layer 174, an average interval between every two adjacent landing pads from among the plurality of landing pads 172, i.e., a width, may increase, thereby preventing a neck phenomenon of a landing pad, in which a problem that the plurality of landing pads 172 are not properly formed or resistance varies may occur.

If a landing pad insulation pattern were to be formed symmetrically, based on the line VL, during etching of a portion of a conductive layer above the conductive barrier layer 174, a cross-sectional area of the conductive layer would be widely etched, thereby lowering the height of a point 174F, i.e., where the landing pad insulation pattern and the conductive barrier layer 174 contact each other. In other words, the height of the point 174F, where the landing pad insulation pattern 160A and the conductive barrier layer 174 contact each other when the landing pad insulation pattern 160A is formed asymmetrically, may be greater than the height of a point where the landing pad insulation pattern and the conductive barrier layer 174 contact each other when the landing pad insulation pattern is formed symmetrically.

For example, the height of the point 174F where the landing pad insulation pattern 160A and the conductive barrier layer 174 contact each other may be greater than the height of an upper limit 154U that is limited by the air spacer 154, due to the landing pad insulation pattern 160A. Accordingly, in the current embodiment, a distance from an upper surface of the metal silicide layer 176 to the landing pad insulation pattern 160A may relatively increase. Due to the geometric characteristics of the landing pad insulation pattern 160A, a phenomenon, in which the metal silicide layer 176 is oxidized by a material forming the landing pad insulation pattern 160A and the conductivity of the metal silicide layer 176 is deteriorated, may be prevented. In other words, the increased height of point 174F according to embodiments, i.e., due to the asymmetrical shape of the landing pad insulation pattern 160A, increased resistance of the metal silicide layer 176 may be prevented or substantially minimized.

Figure 3A:
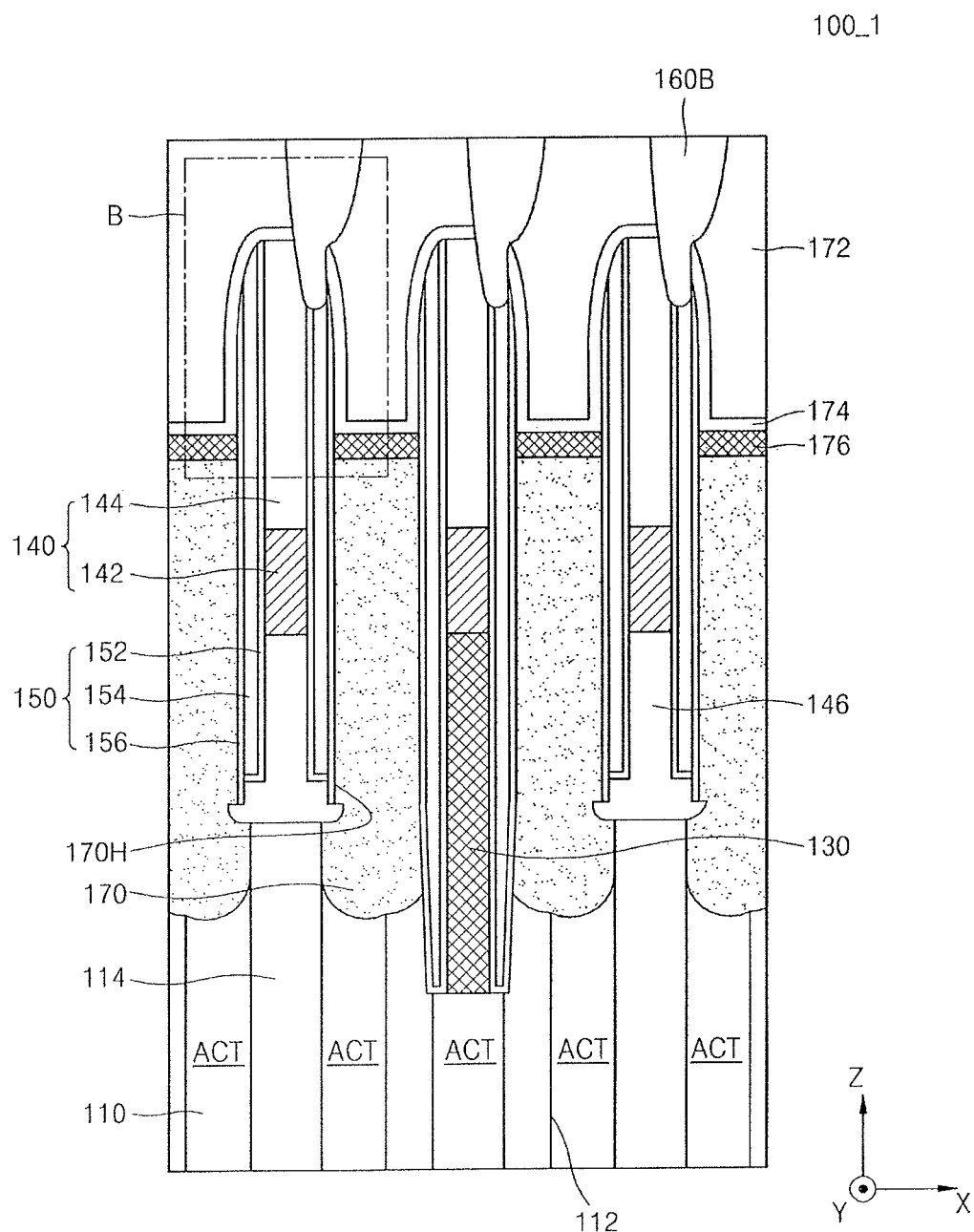
FIG. 3A illustrates a cross-sectional view according to another embodiment corresponding to line A-A' of FIG. 1.
Figure 3B:
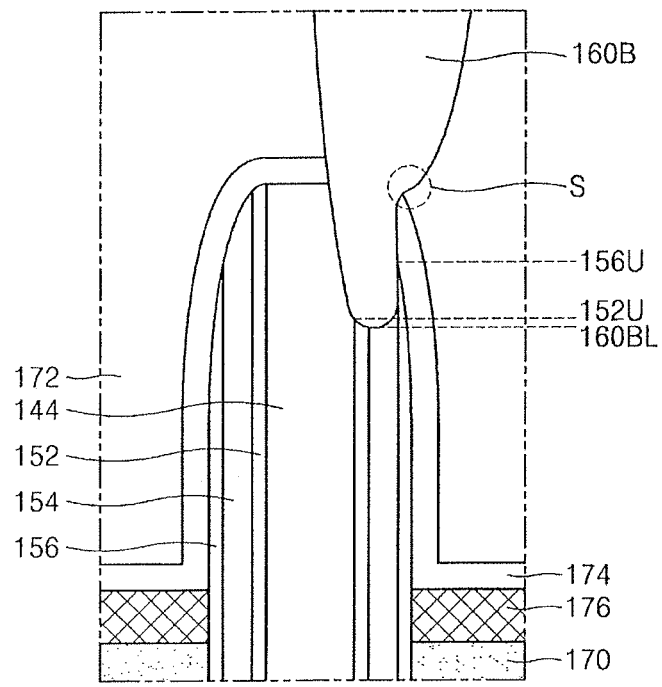
FIG. 3B illustrates a magnified view of a part B of FIG. 3A.

FIG. 3A is a diagram illustrating a semiconductor device 100_1 according to an embodiment, which corresponds a part corresponding to the line A-A' of FIG. 1. FIG. 3B is a magnified view of a part B of the semiconductor device 100_1 of FIG. 3A. In FIGS. 3A and 3B, elements that are the same as those of FIGS. 2A and 2B are indicated by the same reference numerals as those of FIGS. 2A and 2B, and thus, repeated descriptions thereof are not provided for convenience of explanation.

Referring to FIG. 3A, the semiconductor device 100_1 may include the substrate 110 having the active regions ACT, the plurality of conductive line structures 140 formed to be separated from the substrate 110, the plurality of contact plugs 170, and the plurality of landing pads 172. The plurality of contact plugs 170 may be respectively formed between every two adjacent conductive line structures from among the plurality of conductive line structures 140. The plurality of landing pads 172 may be respectively connected to the plurality of contact plugs 170 and be separated from each other by a landing pad insulation pattern 160B. The landing pad insulation pattern 160B may have a stair shape. The landing pad insulation pattern 160B will be described later in detail with reference to FIG. 3B.

The semiconductor device 100_1 may further include the conductive barrier layer 174 formed to cover lower surfaces of the plurality of landing pads 172 and the metal silicide layer 176 formed on the plurality of contact plugs 170.

The plurality of conductive line structures 140 may respectively include the plurality of conductive lines 142 and the plurality of insulation capping lines 144 respectively formed on the plurality of conductive lines 142. The heights of upper surfaces of the plurality of contact plugs 170 may be less than those of upper surfaces of the plurality of insulation capping lines 144.

The plurality of insulating spacer structures 150 may be respectively between the plurality of conductive line structures 140 and the plurality of contact plugs 170. Each of the insulating spacer structures 150 may include the internal insulating spacer 152 contacting a sidewall of each of the conductive line structures 140, the external insulating spacer 156 contacting a sidewall of each of the contact plugs 170, and the air spacer 154 between the internal insulating spacer 152 and the external insulating spacer 156.

The internal insulating spacer 152 and the external insulating spacer 156 may include the same material. In some embodiments, the internal insulating spacer 152 and the external insulating spacer 156 may include silicon nitride.

The upper limit of the air spacer 154 may be limited by the landing pad insulation pattern 160B. The air spacer 154 may be formed to overlap each of the conductive lines 142 in a direction in which a main surface of the substrate 110 extends.

Referring to FIGS. 3A and 3B, the landing pad insulation pattern 160B may include a stair shaped-portion S. In the stair shaped-portion S, the slope of the side thereof may sharply vary at a certain point, e.g., the stair shaped-portion S may have a substantially horizontal segment at an intersection region of the landing pad 172 with the metal barrier layer 174. For example, the stair shaped-portion S may be formed to be adjacent to a region where the landing pad insulation pattern 160B, the metal barrier layer 174, and the landing pads 172 contact each other.

The height of the highest point 156U of the external insulating spacer 156 may be greater than that of the lowest point 160BL of the landing pad insulation pattern 160B. In addition, the height of the highest point 156U of the external insulating spacer 156 may be greater than that of the highest point 152U of the internal insulating spacer 152.

Accordingly, compared to the case in which the landing pad insulation pattern 160B does not include the stair shaped-portion S and is formed asymmetrically, as described with reference to FIGS. 2A and 2B, it may be easy to form the air spacer 154 in the process of forming the landing pad insulation pattern 160B and it is possible to increase a width between the landing pads 172. In addition, a problem that the landing pads 172 are not properly formed or resistance increases may be resolved. In addition, compared to the case in which a landing pad insulation pattern formed not to include a stair shape, a distance from an upper surface of the metal silicide layer 176 to the landing pad insulation pattern 160B may increase. Accordingly, due to the landing pad insulation pattern 160B, a phenomenon in which the conductivity of the metal silicide layer 176 is deteriorated may be prevented.

Figure 4A:
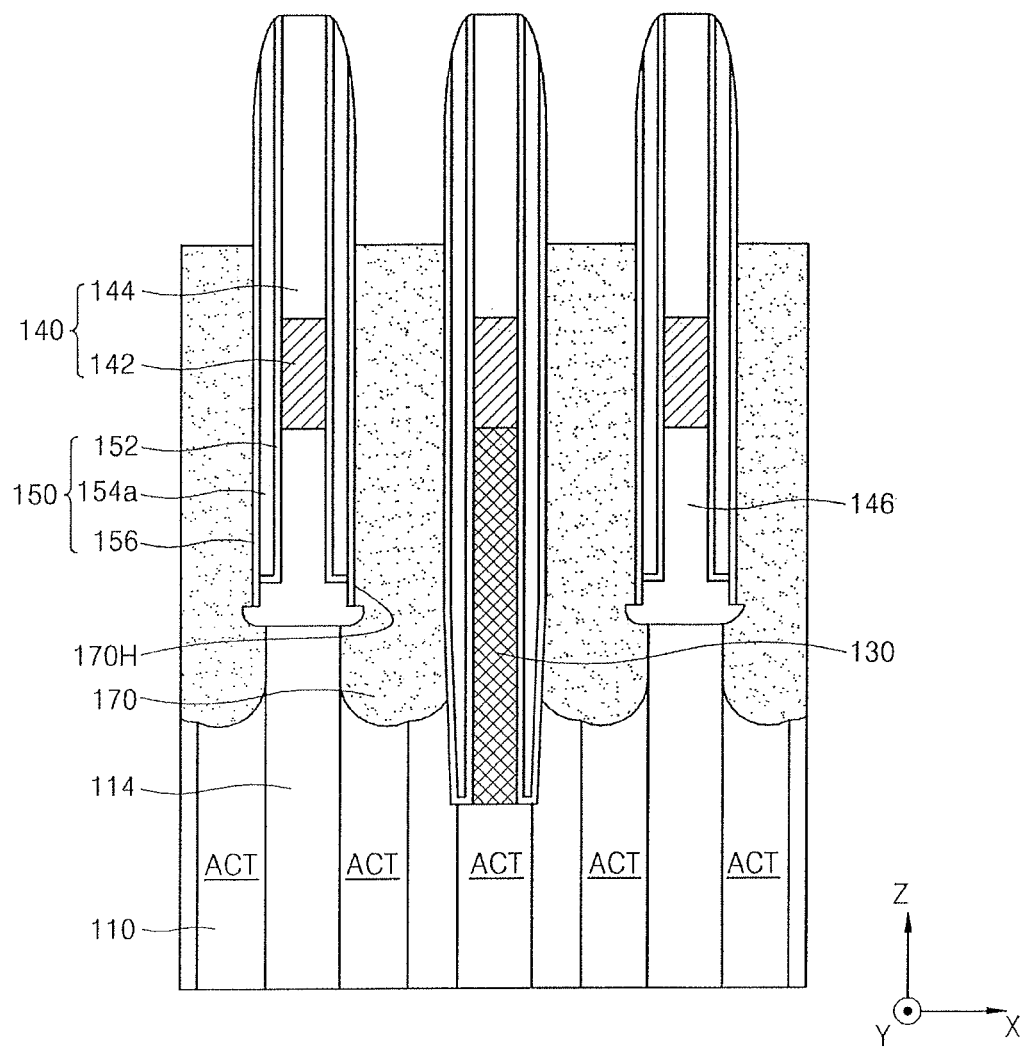
FIGS. 4A to 4F illustrate cross-sectional views of stages in a method of manufacturing a semiconductor device according to an embodiment.
Figure 4B:
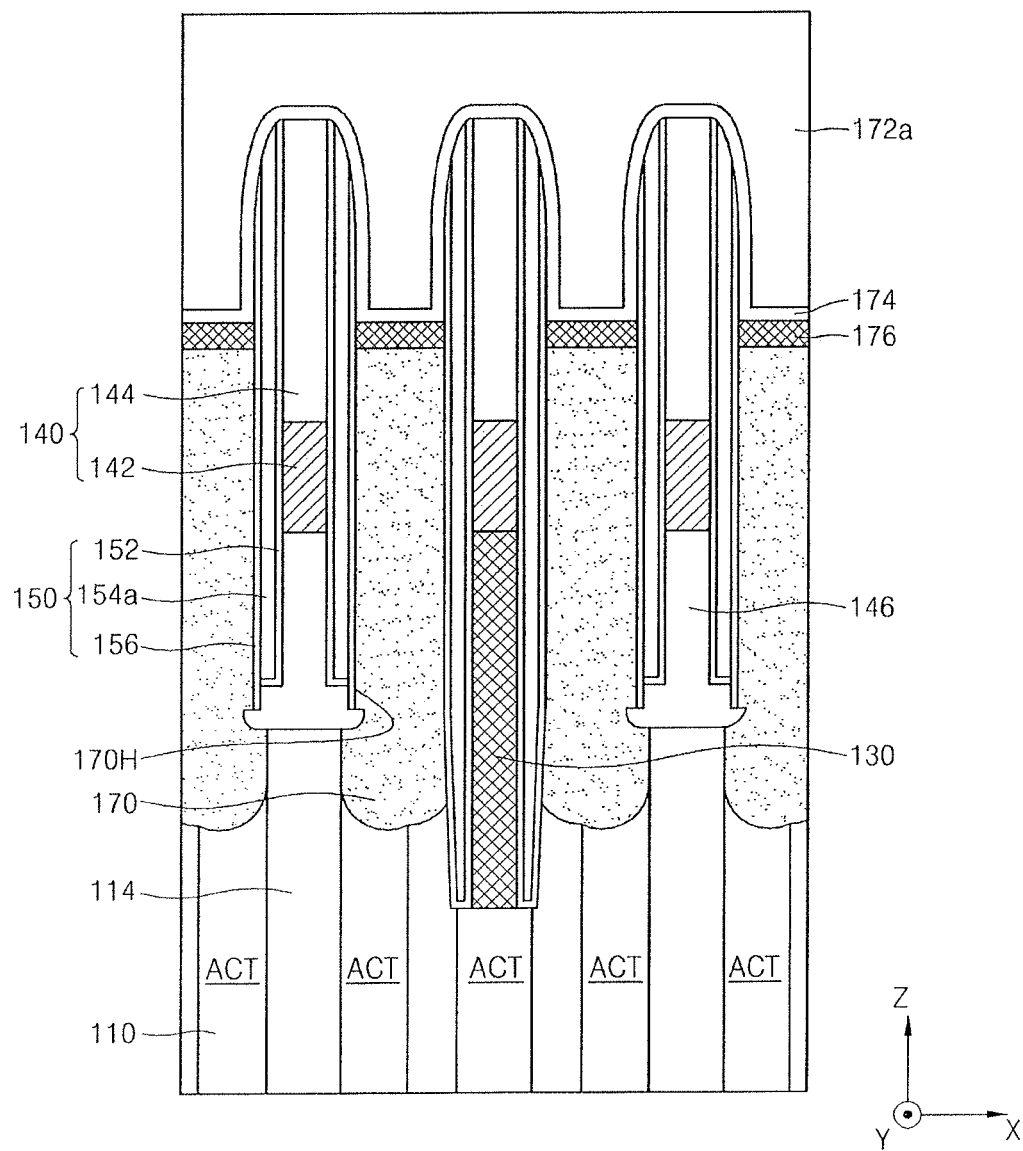
Figure 4C:
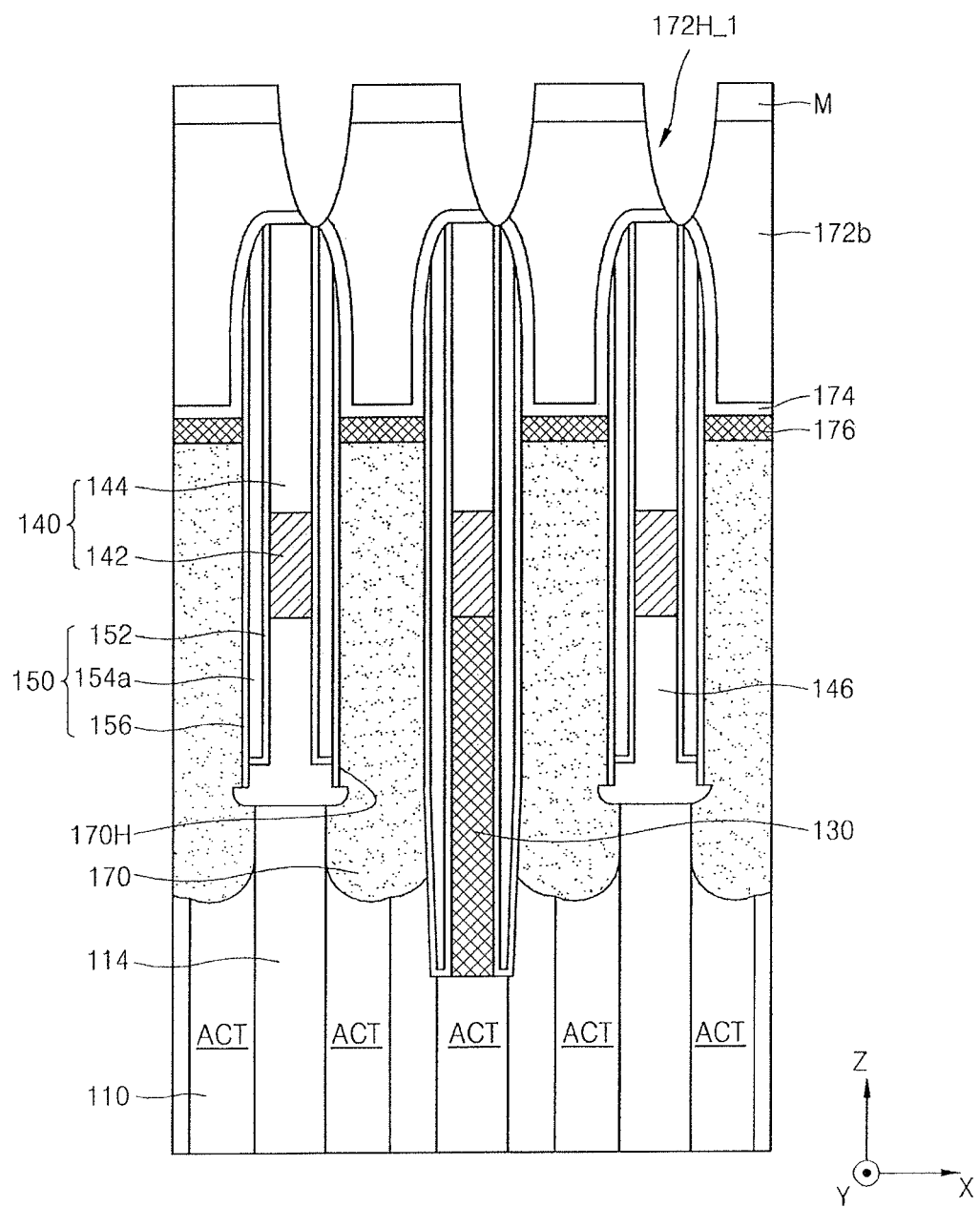
Figure 4D:
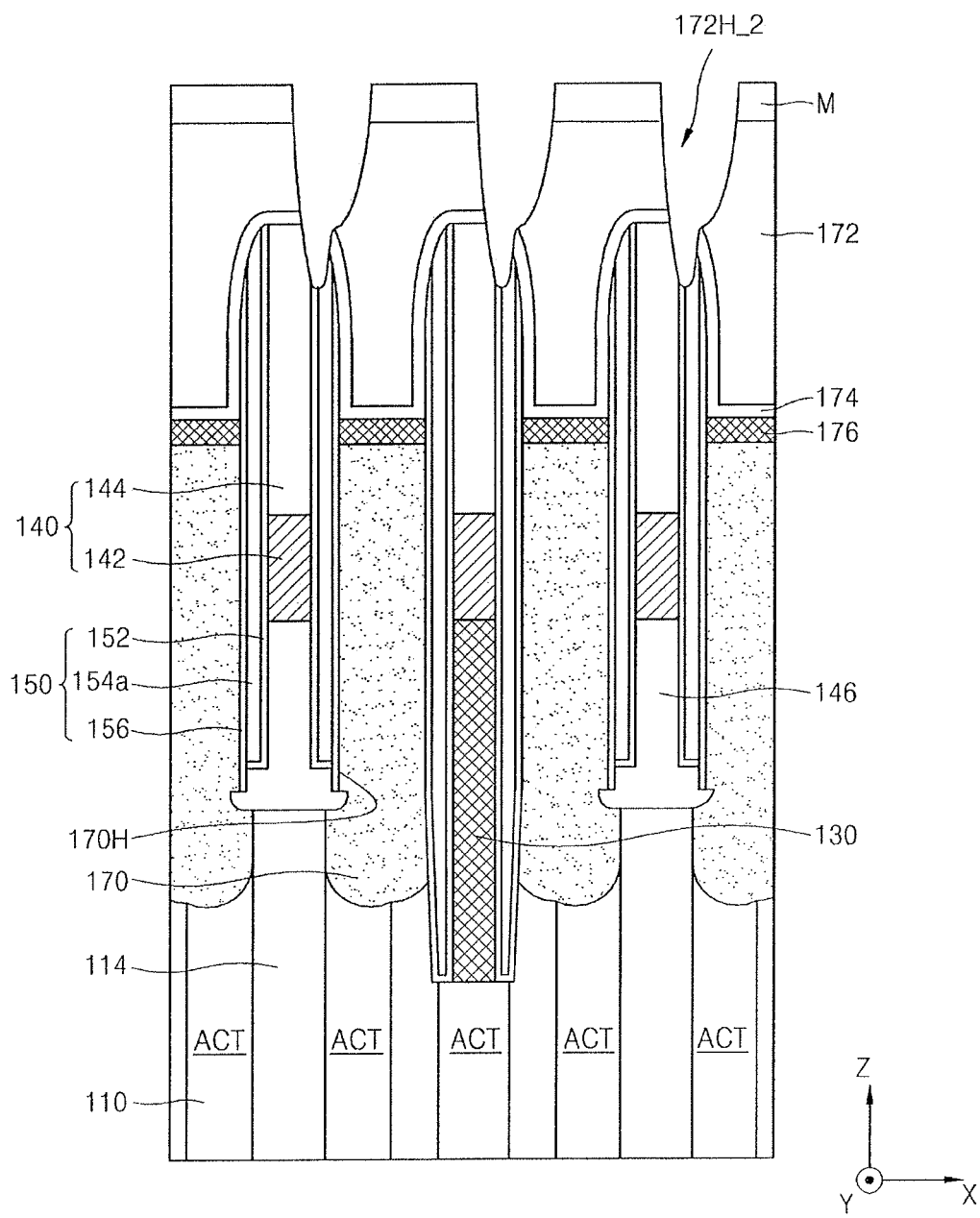
Figure 4E:
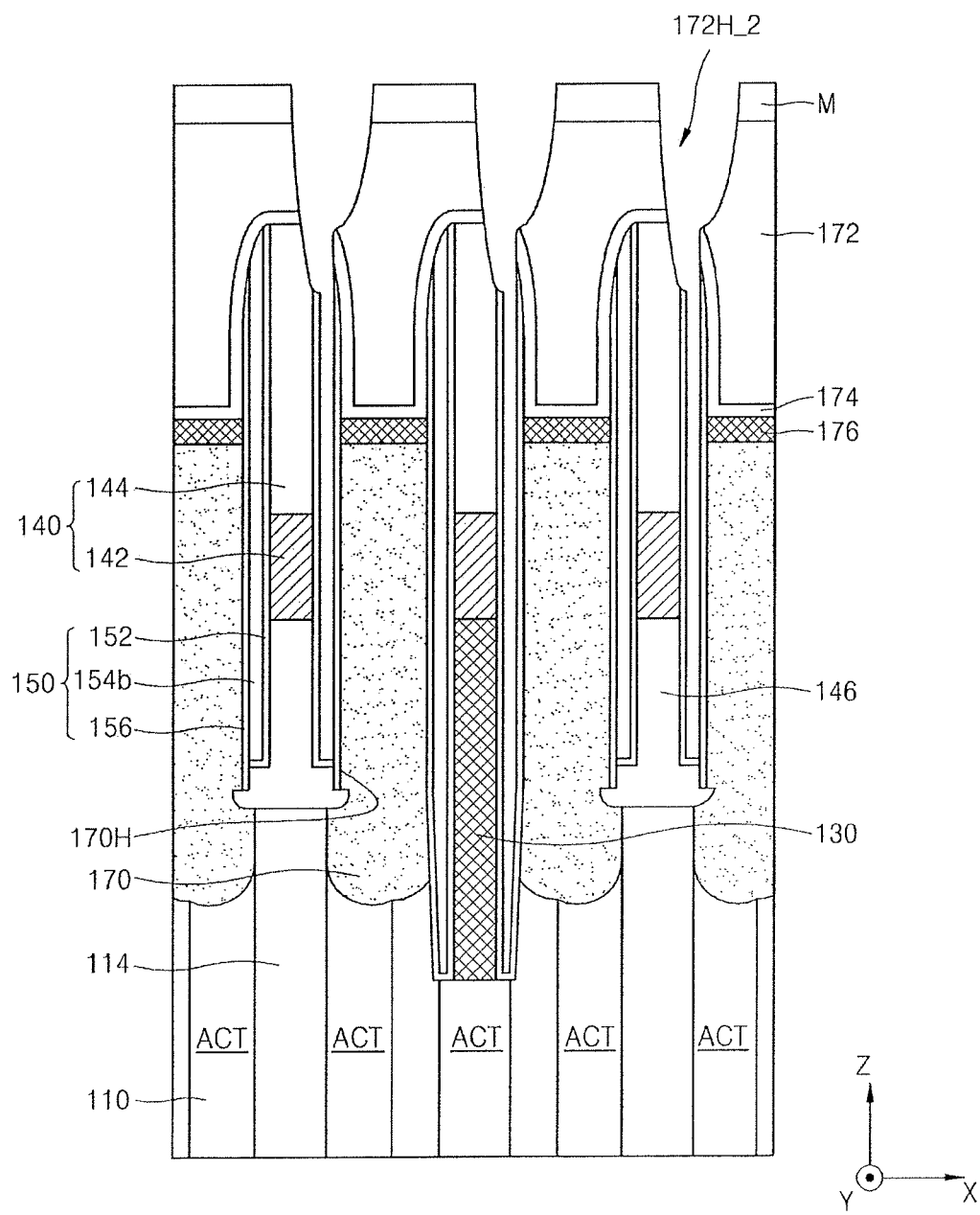
Figure 4F:
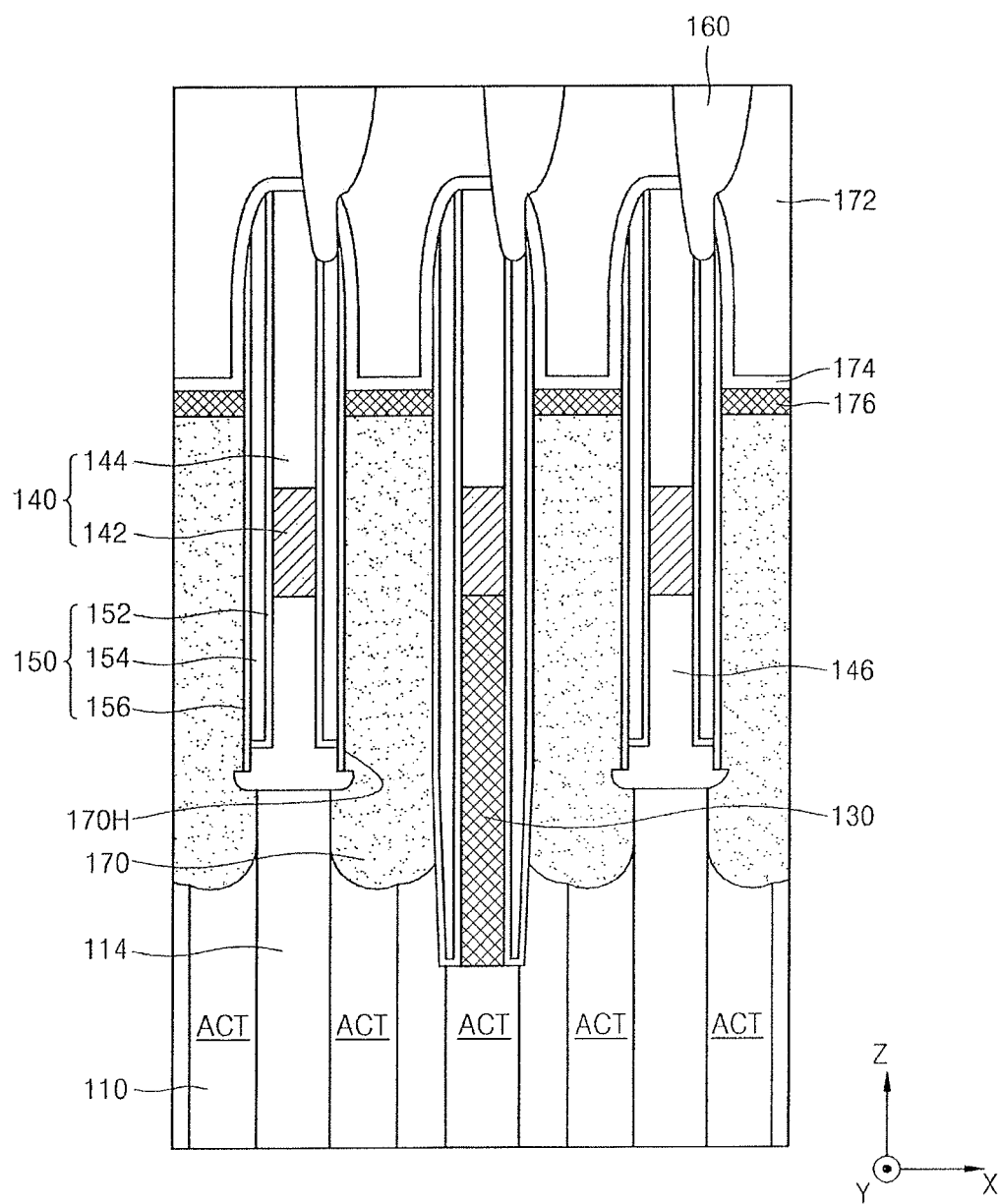

Detailed descriptions will be provided while explaining a method of manufacturing a semiconductor device according to an embodiment, with reference to FIGS. 4D and 4F.

FIGS. 4A to 4F are cross-sectional views illustrating stages in a method of manufacturing a semiconductor device according to an embodiment. FIGS. 4A to 4F correspond to line A-A' of FIG. 1.

Referring to FIG. 4A, an isolation trench is formed in the substrate 110, and the isolation layer 114 is formed inside the isolation trench. The plurality of active regions ACT are defined in the substrate 110 by the isolation layer 114. Each of the active regions ACT may have a relatively long island shape having a long axis and a short axis, like the active regions ACT illustrated in FIG. 1.

The isolation layer 114 may be a single layer including one type of insulating layer or multiple layers including a combination of at least three types of insulating layers. The isolation layer 114 may include at least one selected of, e.g., silicon oxide, silicon nitride, and a combination thereof.

The insulating layer 146 may be formed on the substrate 110, and the plurality of conductive line structures 140 extending in parallel with one another may be formed on the insulating layer 146. The plurality of conductive line structures 140 may respectively include the plurality of conductive lines 142 and the plurality of insulation capping lines 144 respectively covering upper surfaces of the plurality of conductive lines 142.

After a conductive layer for the formation of a conductive line and another insulating layer covering the conductive layer are formed on the insulating layer 146, the insulation capping lines 144 may be formed by patterning the other insulating layer. The plurality of conductive lines 142 may be formed by etching the conductive layer for the formation of the conductive line by using the plurality of insulation capping lines 144 as an etch mask. In this case, the thicknesses of the plurality of insulation capping lines 144 may be greater than those of the plurality of conductive lines 142.

In some embodiments, the plurality of conductive lines 142 may include at least one of, e.g., polysilicon, semiconductor material doped with impurities, metal, conductive metal nitride, or metal silicide. Although an example in which each of the conductive lines 142 includes a single layer is illustrated in FIG. 4A, embodiments are not limited thereto. In some embodiments, each of the conductive lines 142 may have a multi-layer structure in which a metal silicide layer, a metal barrier layer, and an electrode layer including metal or metal nitride are stacked in this stated order. For example, each of the conductive lines 142 may have a stack structure in which, e.g., doped polysilicon, TiN, and tungsten, are sequentially stacked. In some embodiments, each of the insulation capping lines 144 may include, e.g., a silicon nitride layer.

The plurality of insulating spacer structures 150 respectively covering sidewalls of the plurality of conductive line structures 140 may be formed. A first insulating spacer 152, a second insulating spacer 154a, and a third insulating spacer 156 may be sequentially formed on the sidewall of each of the conductive line structures 140. The first insulating spacer 152 may be formed to cover a side surface and a lower surface of the second insulating spacer 154a, but is not limited thereto.

Although each of the insulating spacer structures 150 includes a triple layer, embodiments are not limited thereto, e.g., each of the insulating spacer structures 150 may include a single layer, a double layer, or a multi-layer structure including four or more layers. Each of the insulating spacer structures 150 may include at least one of, e.g., a silicon oxide layer, a silicon nitride layer, and a combination thereof.

The first insulating spacer 152 and the third insulating spacer 156 may include the same material. For example, the first insulating spacer 152 and the third insulating spacer 156 may include silicon nitride. In this case, the second insulating spacer 154a may include oxide.

After an insulating material is deposited to cover upper surfaces and sidewalls of the plurality of conductive line structures 140, the first insulating spacer 152, the second insulating spacer 154a, and the third insulating spacer 156 may be formed in this stated order by etching a portion of the deposited insulating material. Accordingly, by using the etching process, the first insulating spacer 152, the second insulating spacer 154a, and the third insulating spacer 156 may be formed so that the heights of the first to third insulating spacers 152, 154a, and 156 are less than those of the insulation capping lines 144.

In FIG. 4A, although the height of the second insulating spacer 154a is less than that of the first insulating spacer 152 and the height of the third insulating spacer 156 is less than that of the second insulating spacer 154a, embodiments are not limited thereto. In some embodiments, the height of the second insulating spacer 154a may be less than that of the first insulating spacer 152 and that of the third insulating spacer 156. In this case, the third insulating spacer 156 may be formed to cover an upper surface of the second insulating spacer 154a and extend in a direction (Z direction) that is perpendicular to the substrate 110. In some other embodiments, the height of the second insulating spacer 154a may be formed to be less than that illustrated in FIG. 4A, and the first insulating spacer 152 or another insulating material may be additionally formed to cover the upper surface of the second insulating spacer 154a.

A plurality of contact holes 170H exposing the active regions ACT of the substrate 110 may be formed by removing portions of structures that are exposed due to the insulating spacer structures 150 between the conductive line structures 140. In some embodiments, anisotropic etching, isotropic etching, or a combination there of may be used to form the plurality of contact holes 170H.

After a conductive material for contact formation is filled in the plurality of contact holes 170H, a plurality of contact plugs 170 may be formed by selectively removing a portion of the conductive material for contact formation by using an etch process having etch selectivity. For example, chemical vapor deposition, physical vapor deposition, and silicon epitaxial growth may be used to fill the plurality of contact holes 170H that are recess spaces. The conductive material for contact formation may include semiconductor material doped with impurities, metal, conductive metal nitride, metal silicide, or a combination thereof, but is not limited thereto.

The heights of the plurality of contact plugs 170 may be lowered by selectively removing only the conductive material for contact formation by using a dry etch process using silane gas or an etch-back process. By using the process method described above, the plurality of contact plugs 170 may be formed to have upper levels that are lower than the plurality of conductive line structures 140 and the plurality of insulating spacer structures 150.

Referring to FIG. 4B, a metal silicide layer 176 may be formed on each of the plurality of contact plugs 170. In some embodiments, the metal silicide layer 176 may include, e.g., cobalt silicide, nickel silicide, or manganese silicide, but is not limited thereto. In some embodiments, the metal silicide layer 176 may be omitted.

In some embodiments, the following processes may be performed to form the metal silicide layer 176. After a metal layer is formed on an exposed surface of an upper surface of each of the contact plugs 170, the metal layer is silicified by performing a first rapid thermal process (RTP). The first RTP may be performed at a temperature of about 450° C. to about 550° C. After a metal layer that does not react with silicon atoms during the first RTP is removed, the metal silicide layer 176 is formed by performing a second RTP at a temperature higher the temperature in the first RTP, e.g., at a temperature of about 800° C. to about 950° C. Next, an unreacted portion of the metal layer is removed. In some embodiments, a cobalt metal layer may be used as the metal layer and thus a metal silicide layer 176 including cobalt silicide may be formed.

A conductive barrier layer 174 may be formed, e.g., confromally, to cover an upper surface of the metal silicide layer 176, upper surfaces of the conductive line structures 140, and upper surfaces of the insulating spacer structures 150. In some embodiments, the conductive barrier layer 174 may include titanium or titanium nitride.

A first conductive layer 172a for forming a landing pad may be formed on the metal silicide layer 176. The first conductive layer 172a may include, e.g., doped polysilicon, metal, metal silicide, conductive metal nitride, or a combination thereof. For example, the first conductive layer 172a may include tungsten.

Referring to FIGS. 4B and 4C, a mask pattern M exposing a portion of the first conductive layer 172a may be formed on the first conductive layer 172a. The mask pattern M may include a plurality of island-type mask patterns. The mask pattern M may include a carbon-containing layer. For example, the mask pattern M may include a spin-on hardmask (SOH) or an amorphous carbon layer (ACL).

A portion of the first conductive layer 172a and a portion of the conductive barrier layer 174 may be removed through a first etch process using the mask pattern M as an etch masks. In this case, the insulation capping lines 144 and the first insulating spacers 152, formed on the conductive line structures 140, may be partially removed. Accordingly, a first landing pad recess region 172H_1 and a second conductive layer 172b for forming a landing pad may be formed. The second conductive layer 172b may have a plurality of island shapes. However, the second insulating spacer 154a may not be etched and thus may not be exposed to the outside.

Referring to FIGS. 4C and 4D, a second landing pad recess region 172H_2 and a plurality of landing pads 172 may be formed by performing a second etch process without removing the mask pattern M formed on the second conductive layer 172b. The second etch process may be an etch process having etch selectivity for an insulating material, and an etch rate of the insulating material may be higher than that of a conductive material. Accordingly, during the second etch process, the amount by which the insulating material is removed may be much more than the amount by which the conductive material is removed (of the conductive barrier layer 174 and second conductive layer 172b). As such, the depth of a portion of region 172H_2 through the insulation capping lines 144 is larger than the depth of a portion of region 172H_2 through the conductive barrier layer 174 and the second conductive layer 172b.

The second etch process may be a dry etch process using a gas, e.g., $C_XF_Y$, $CH_XF_Y$, or $CH_4$ (where X and Y are natural numbers). Carbon-based materials and insulating materials, adsorbed onto a surface of the second landing pad recess region 172H_2 after being emitted from the mask pattern M, may react with gases used in the second etch process and then be removed.

That is, portions of the plurality of insulation capping lines 144 and portions of the plurality of insulating spacer structures 150, which contact the first landing pad recess region 172H_1, may be removed, and the conductive barrier layer 174 and the second conductive layer 172b may not be removed. Alternatively, the extent to which portions of the plurality of insulation capping lines 144 and portions of the plurality of insulating spacer structures 150, which contact the first landing pad recess region 172H_1, are etched may be greater than the extent to which the conductive barrier layer 174 and the second conductive layer 172b are etched.

The second insulating spacer 154a that has not been exposed in the first etch process may be exposed by the second etch process. Accordingly, the second landing pad recess region 172H_2 may be asymmetrically formed, based on a line that is perpendicular to a main surface of the substrate 110. For example, the second landing pad recess region 172H_2 may have a stair shape.

In some embodiments, the height of the second insulating spacer 154a may be less than that illustrated in FIG. 4C, and the first insulating spacer 152, the third insulating spacer 156, or another insulating material may cover an upper portion of the second insulating spacer 154a. In this case, the second etch process may be performed several times to expose the second insulating spacer 154a to the outside. Portions of the plurality of insulation capping lines 144 and portions of the plurality of insulating spacer structures 150, which contact the first landing pad recess region 172H_1, may be deeply etched.

In a comparison example that is different from the current embodiment, in order to expose the second insulating spacer 154a to the outside and form an air spacer in a subsequent process, a first etch process that does not have etch selectivity for insulating material may be performed several times, instead of additionally performing a second etch process having etch selectivity for insulating material. In this case, however, a portion of the conductive barrier layer 174 and a portion of the second conductive layer 172b, as well as portions of the plurality of insulation capping lines 144 and portions of the plurality of insulating spacer structures 150, which contact the first landing pad recess region 172H_1, may be removed together. Therefore, if a single etch process without etch selectivity for an insulating material were to be performed several times to expose the second insulating spacer 154a, a resultant landing pad recess region would be symmetrical, and the width of each of the landing pads 172 would be reduced, thereby increasing the resistance of each of the landing pads 172. In addition, the potentially resultant symmetrical landing pad recess region would decrease a distance between the metal silicide layer 176 and the landing pad recess region, thereby causing the conductive material of the metal silicide layer 176 to be oxidized during deposition of an insulating material in the landing pad recess region in a subsequent process, which in turn, would cause increased resistance of the metal silicide layer 176.

Therefore, according to example embodiments, portions of the plurality of insulation capping lines 144 and portions of the plurality of insulating spacer structures 150, which contact the first landing pad recess region 172H_1, are selectively removed at a relatively high etch rate through the second etch process having etch selectivity for insulating material. As such, increased resistance of each of the landing pads 172 and of the metal silicide layer 176 may be prevented or substantially minimized. Further, exposure of the second insulating spacer 154a to the outside to form the air spacer 154 may be facilitated.

Referring to FIGS. 4D and 4E, the second insulating spacer 154a exposed by the second landing pad recess region 172H_2 may be removed. The second insulating spacer 154a may include an insulating material, i.e., at least one of silicon oxide, silicon nitride, and a combination thereof, and the second insulating spacer 154a may be removed by using a material having etch selectivity for selectively removing the insulating material included in the second insulating spacer 154a. For example, when the second insulating spacer 154a includes silicon oxide and the first and third insulating spacers 152 and 156 include silicon nitride, the second insulating spacer 154a may be selectively removed by a wet etch method using a cleaning solution including an LAL solution or an SC-1 solution for selectively removing only silicon oxide.

Air may flow into an air spacer recess region 154b from which the second insulating spacer 154a has been removed. Although an example in which the second insulating spacer 154a is completely removed and then the air spacer recess region 154b is formed is shown in FIG. 4E, a portion of the second insulating spacer 154a which is close to the substrate 110 may remain without being removed.

Referring to FIGS. 4E and 4F, the landing pad insulation pattern 160 is formed by filling the second landing pad recess region 172H_2 with an insulating material. The insulating material used to form the landing pad insulation pattern 160 may be, e.g., silicon oxide or silicon nitride.

The insulating material forming the landing pad insulation pattern 160 may be a material with poor step coverage. Accordingly, the insulating material may not reach the air spacer recess region 154b and may fill only the second landing pad recess region 172H_2. However, embodiments are not limited thereto, and the insulating material may fill a portion of the air spacer recess region 154b. When the insulating material fills a portion of an upper portion of the air spacer recess region 154b, a height at which the landing pad insulation pattern 160 starts to be formed may be lowered. In other words, the lowest point of the landing pad insulation pattern 160 may be lowered.

The landing pad insulation pattern 160 may include a stair shaped-portion. In other words, the landing pad insulation pattern 160 may include a region where the slope of the side thereof sharply varies at a certain point. For example, the stair shaped-portion may be formed to be adjacent to a region where the landing pad insulation pattern 160B, the metal barrier layer 174, and the landing pads 172 contact each other.

Alternatively, the landing pad insulation pattern 160 may be formed asymmetrically, based on a line that passes the lowest point 160AL of the landing pad insulation pattern 160 and is perpendicular to the main surface of the substrate 110. This is because an insulating material is removed much more than a conductive material in the second etch process for forming the second landing recess region 172H_2 and the landing pad insulation pattern 160 is formed by filling the second landing pad recess region 172H_2 with an insulating material.

The landing pad insulation pattern 160 may include a first region overlapping the conductive line structures 140 and a second region overlapping the contact plugs 170, in a direction perpendicular to the main surface of the substrate 110, and the first region may be deeper than the second region, based on the upper surface of the landing pad insulation pattern 160.

Air flowing into the air spacer recess region 154b may be confined in the air spacer recess region 154b by the landing pad insulation pattern 160. Accordingly, air spacers 154 may be respectively formed between the contact plugs 170 and the conductive lines 142. An upper limit of each of the air spacers 154 may be limited by the landing pad insulation pattern 160. The first insulating spacer 152 and the third insulating spacer 156 may correspond to the internal insulating spacer 152 and the external insulating spacer 154, respectively, illustrated in FIGS. 3A and 3B.

As the air spacers 154 are respectively formed between the contact plugs 170 and the conductive lines 142, relative permittivity between the contact plugs 170 and the conductive lines 142 may decrease and capacitance between conductive lines adjacent to each other may decrease.

The plurality of landing pads 172 may have a plurality of island-type pattern shapes when they are viewed at a plane that is parallel with the main surface of the substrate 110, due to the landing pad insulation pattern 160. The plurality of conductive landing pads 172 may be electrically connected to a lower electrode of a capacitor including the lower electrode, a dielectric layer, and an upper electrode.

By way of summation and review, when connecting a lower electrode of a capacitor to an active region of a substrate via a contact plug having a small cross-sectional area, a mutual bridge phenomenon of a landing pad may occur and resistance may increase. In addition, parasitic capacitance between a plurality of interconnection lines and a plurality of contact plugs may occur.

In contrast, embodiments provide a semiconductor device including a landing pad between a contact plug and a capacitor lower electrode to connect the capacitor lower electrode to an active region of a substrate via the contact plug. Embodiments also provide a semiconductor device for preventing an increase in the resistance of landing pads and preventing the deterioration of the conductivity of a metal silicide layer that is formed on a plurality of contact plugs.

That is, a landing pad recess region may be formed by two etch processes, with the second etch process having a relatively high etch selectivity with respect to insulating material, such that the extent to which a spacer structure is etched may be greater than the extent to which the landing pad material layer and the conductive barrier layer are etched. Accordingly, in a semiconductor device according to embodiments, the landing pad insulation pattern may be asymmetrically formed and have a stair shape. As such, the asymmetrical shape prevents decrease of the widths of the landing pads, thereby preventing or minimizing increased resistances of the landing pads. In addition, since a distance between a metal silicide layer and the landing pad insulation pattern does not decrease, oxidation of the metal silicide layer may be prevented, thereby preventing decrease of conductivity of the metal silicide layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device comprising:
   a substrate including a first isolation layer, a second isolation layer, a first active region, and a second active region, the first active region being between the first isolation layer and the second isolation layer, and the second active region being on a side of the second isolation layer;
   a first bit line structure on the first isolation layer and a second bit line structure on the second active region;
   a contact plug on both the first active region and the second isolation layer, the contact plug being between the first bit line structure and the second bit line structure;
   a first spacer structure on a first sidewall of the first bit line structure and including a first air gap, and a second spacer structure on a second sidewall of the first bit line structure and including a second air gap, the second spacer structure being between the first bit line structure and the contact plug;
   a third spacer structure on a first sidewall of the second bit line structure and including a third air gap, and a fourth spacer structure on a second sidewall of the second bit line structure and including a fourth air gap, the third spacer structure being between the contact plug and the second bit line structure;
   a landing pad on the contact plug, the landing pad including a first side and a second side opposite to the first side;
   a first landing pad insulation pattern on the first side of the landing pad and on the second spacer structure; and
   a second landing pad insulation pattern on the second side of the landing pad and on the fourth spacer structure,
   wherein at least one of the first landing pad insulation pattern and the second landing pad insulation pattern has an asymmetrical shape in a vertical direction, and
   wherein a height of the first air gap is greater than a height of the second air gap, and a height of the third air gap is greater than a height of the fourth air gap.

2. The semiconductor device of claim 1, wherein the height of the third air gap is greater than the height of the first air gap, and the height of the fourth air gap is greater than the height of the second air gap.

3. The semiconductor device of claim 1, further comprising an insulating layer between an end portion of the first isolation layer and the first bit line structure.

4. The semiconductor device of claim 1, wherein each of the first landing pad insulation pattern and the second landing pad insulation pattern includes a stair shaped-portion.

5. The semiconductor device of claim 1, wherein:
   the landing pad includes a first region between the first bit line structure and the second bit line structure, and a second region on both the first region and the second bit line structure, the second region having a sloped sidewall, and
   an interface between the first region and the second region of the landing pad is substantially coplanar with a top surface of at least one of the first bit line structure and the second bit line structure.

6. The semiconductor device of claim 5, wherein a first width of a top portion of the second region of the landing pad is less than a second width of a bottom portion of the second region of the landing pad.

7. The semiconductor device of claim 1, further comprising a direct contact between an end of the second active region and the second bit line structure.

8. The semiconductor device of claim 7, wherein the third air gap covers a first sidewall of the direct contact and extends in the substrate, and the fourth air gap covers a second sidewall of the direct contact and extends in the substrate.

9. The semiconductor device of claim 1, further comprising a metal silicide layer between an end of the contact plug and the landing pad.

10. The semiconductor device of claim 1, further comprising a conductive barrier layer between the contact plug and the landing pad, the conductive barrier layer being in contact with the first air gap and the third air gap.

11. The semiconductor device of claim 10, wherein:
   the first spacer structure includes a first inner spacer and a first outer spacer, the first air gap being between the first inner spacer and the first outer spacer,
   the second spacer structure includes a second inner spacer and a second outer spacer, the second air gap being between the second inner spacer and the second outer spacer, the third spacer structure includes a third inner spacer and a third outer spacer, the third air gap being between the third inner spacer and the third outer spacer, and the fourth spacer structure includes a fourth inner spacer and a fourth outer spacer, the fourth air gap being between the fourth inner spacer and the fourth outer spacer.

12. The semiconductor device of claim 11, wherein:

the first bit line structure includes a first insulation capping line and the second bit line structure includes a second insulation capping line, and the first landing pad insulation pattern is in contact with the first insulation capping line, the conductive barrier layer, and the second air gap, and the second landing insulation pattern is in contact with the second insulation capping line, the conductive barrier layer, and the fourth air gap.

13. The semiconductor device of claim 12, wherein the first landing pad insulation pattern is in contact with the second inner spacer and the second outer spacer, and the second landing pad insulation pattern is in contact with the fourth inner spacer and the fourth outer spacer.

14. A semiconductor device comprising:

a substrate including a first isolation layer, a second isolation layer, a first active region, and a second active region, the first active region being between the first isolation layer and the second isolation layer, and the second active region being on a side of the second isolation layer;

a first bit line structure on the first isolation layer, the first bit line structure including a first spacer structure on a first sidewall of the first bit line structure and a second spacer structure on a second sidewall of the first bit line structure;

a second bit line structure on the second active region, the second bit line structure including a third spacer structure on a first sidewall of the second bit line structure and a fourth spacer structure on a second sidewall of the second bit line structure;

a contact plug on both the first active region and the second isolation layer, the contact plug being between the first bit line structure and the second bit line structure;

a landing pad on the contact plug, the landing pad including a first region between the first bit line structure and the second bit line structure, and a second region on both the first region and the second bit line structure, the second region including a first side and a second side opposite to the first side, and each of the first side and the second side having a slope;

a first landing pad insulation pattern on the first side of the second region of the landing pad and on the second spacer structure; and a second landing pad insulation pattern on the second side of the second region of the landing pad and on the fourth spacer structure, wherein a first width of a top portion of the second region of the landing pad is less than a second width of a bottom portion of the second region of the landing pad, and wherein at least one of the first landing pad insulation pattern and the second landing pad insulation pattern has an asymmetrical shape in a vertical direction.

15. The semiconductor device of claim 14, wherein:

the first spacer structure includes a first inner spacer, a first outer spacer, and a first intermediate spacer between the first inner spacer and the first outer spacer, the second spacer structure includes a second inner spacer, a second outer spacer, and a second intermediate spacer between the second inner spacer and the second outer spacer, the third spacer structure includes a third inner spacer, a third outer spacer, and a third intermediate spacer between the third inner spacer and the third outer spacer, and the fourth spacer structure includes a fourth inner spacer, a fourth outer spacer, and a fourth intermediate spacer between the fourth inner spacer and the fourth outer spacer.

16. The semiconductor device of claim 15, wherein the first intermediate spacer includes a first air gap, the second intermediate spacer includes a second air gap, the third intermediate spacer includes a third air gap, and the fourth intermediate spacer includes a fourth air gap.

17. The semiconductor device of claim 15, wherein a height of the first intermediate spacer is greater than a height of the second intermediate spacer, and a height of the third intermediate spacer is greater than a height of the fourth intermediate spacer.

18. The semiconductor device of claim 15, further comprising a conductive barrier layer between an end of the contact plug and the landing pad, wherein the first landing pad insulation pattern is in contact with the conductive barrier layer, the second inner spacer, the second intermediate spacer, and the second outer spacer, and wherein the second landing pad insulation pattern is in contact with the conductive barrier layer, the fourth inner spacer, the fourth intermediate spacer, and the fourth outer spacer.

19. The semiconductor device of claim 14, further comprising an insulating layer between an end portion of the first isolation layer and the first bit line structure.

20. The semiconductor device of claim 14, wherein an interface between the first region and the second region of the landing pad is coplanar with a top surface of at least one of the first bit line structure and the second bit line structure.

* * * * *